United States Patent
Nagaoka et al.

(10) Patent No.: US 8,299,496 B2
(45) Date of Patent: *Oct. 30, 2012

(54) SEMICONDUCTOR DEVICE HAVING SEMICONDUCTOR SUBSTRATE INCLUDING DIODE REGION AND IGBT REGION

(75) Inventors: Tatsuji Nagaoka, Aichi-gun (JP); Akitaka Soeno, Toyota (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/242,960

(22) Filed: Sep. 23, 2011

(65) Prior Publication Data

US 2012/0007142 A1    Jan. 12, 2012

Related U.S. Application Data

(63) Continuation of application No. PCT/JP2009/065606, filed on Sep. 7, 2009.

(51) Int. Cl.
*H01L 29/74* (2006.01)
*H01L 31/111* (2006.01)

(52) U.S. Cl. ........ 257/140; 257/146; 257/133; 257/139; 438/135

(58) Field of Classification Search .................. 257/140, 257/133, 139, 146, E27.016; 438/135
See application file for complete search history.

(56) References Cited

U.S. PATENT DOCUMENTS

| | | |
|---|---|---|
| 5,086,324 A | 2/1992 | Hagino |
| 5,171,696 A | 12/1992 | Hagino |
| 5,808,352 A | 9/1998 | Sakamoto |
| 6,054,748 A | 4/2000 | Tsukuda et al. |
| 6,504,184 B2 | 1/2003 | Alok |
| 2005/0017290 A1 | 1/2005 | Takahashi et al. |
| 2005/0258493 A1 | 11/2005 | Aono et al. |
| 2007/0080407 A1 | 4/2007 | Kono |
| 2007/0158680 A1* | 7/2007 | Ozeki et al. .................. 257/146 |
| 2008/0258172 A1 | 10/2008 | Takahashi et al. |
| 2009/0278166 A1 | 11/2009 | Soeno et al. |

(Continued)

FOREIGN PATENT DOCUMENTS

JP    2-126682 A    5/1990

(Continued)

OTHER PUBLICATIONS

International Search Report of PCT/JP2009/065606 mailed Dec. 8, 2009 & Written Opinion.

(Continued)

*Primary Examiner* — Theresa T Doan
(74) *Attorney, Agent, or Firm* — Kenyon & Kenyon LLP

(57) ABSTRACT

Provided is a semiconductor device including a semiconductor substrate in which a diode region and an IGBT region are formed. A separation region formed of a p-type semiconductor is formed in a range between the diode region and the IGBT region and extending from an upper surface of the semiconductor substrate to a position deeper than both a lower end of an anode region and a lower end of a body region. A diode lifetime control region is formed within a diode drift region. A carrier lifetime in the diode lifetime control region is shorter than that in the diode drift region outside the diode lifetime control region. An end of the diode lifetime control region on an IGBT region side is located right below the separation region.

2 Claims, 1 Drawing Sheet

U.S. PATENT DOCUMENTS

| | | | |
|---|---|---|---|
| 2010/0009551 A1 | 1/2010 | Inoue | |
| 2010/0140658 A1 | 6/2010 | Koyama et al. | |
| 2011/0193132 A1* | 8/2011 | Kouno et al. | 257/139 |
| 2012/0007141 A1* | 1/2012 | Soeno | 257/140 |

FOREIGN PATENT DOCUMENTS

| | | |
|---|---|---|
| JP | 04-214674 A | 8/1992 |
| JP | 07-135214 A | 5/1995 |
| JP | 8-227895 A | 9/1996 |
| JP | 10-041510 A | 2/1998 |
| JP | 10-321877 A | 12/1998 |
| JP | 2005-057235 A | 3/2005 |
| JP | 2005-317751 A | 11/2005 |
| JP | 2007-103770 A | 4/2007 |
| JP | 2008-004866 A | 1/2008 |
| JP | 2008-004867 A | 1/2008 |
| JP | 2008-047565 A | 2/2008 |
| JP | 2008-192737 A | 8/2008 |
| JP | 2008-211148 A | 9/2008 |
| JP | 2008-235405 A | 10/2008 |
| JP | 2009-170670 A | 7/2009 |
| JP | 2009-272550 A | 11/2009 |
| WO | 2009070911 | 12/2009 |
| WO | 2011/027473 A1 | 3/2011 |
| WO | 2011/030454 A1 | 3/2011 |

OTHER PUBLICATIONS

International Preliminary Report on Patentability of PCT/JP2009/065606 issued Nov. 5, 2010.

International Search Report of PCT/JP2009/070911 mailed Mar. 16, 2010 & Written Opinion.

Translation of International Preliminary Report on Patentability of PCT/JP2009/065606 issued Nov. 5, 2010.

Office Action issued Jun. 18, 2012 in U.S. Appl. No. 13/242,789.

* cited by examiner

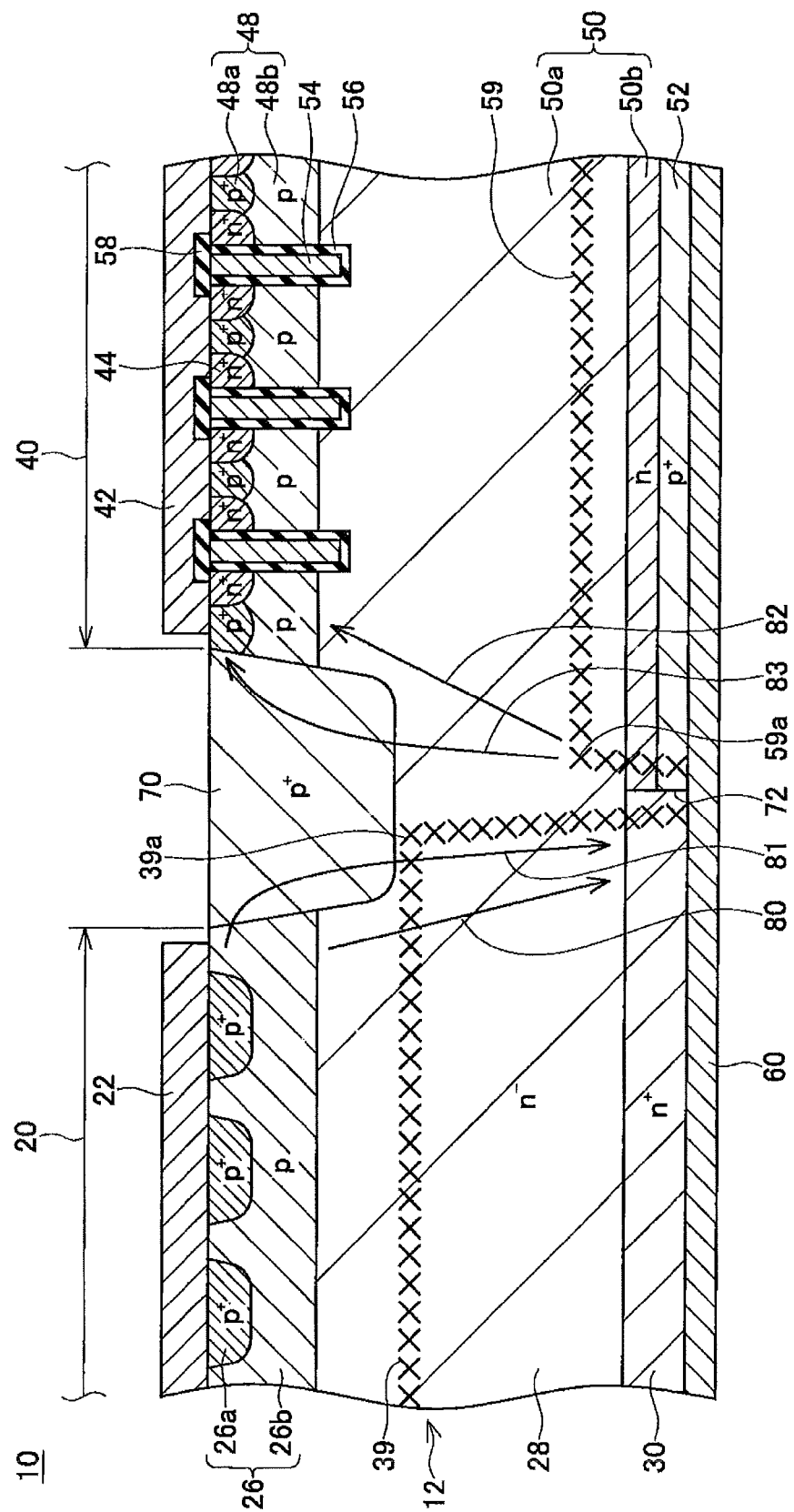

SEMICONDUCTOR DEVICE HAVING SEMICONDUCTOR SUBSTRATE INCLUDING DIODE REGION AND IGBT REGION

CROSS-REFERENCE TO RELATED APPLICATION

This application is a continuation of PCT application serial no. PCT/JP2009/065606 filed on Sep. 7, 2009, the disclosure of which is hereby incorporated by reference herein in its entirety.

TECHNICAL FIELD

The present teachings relate to a semiconductor device having a semiconductor substrate in which a diode region and an IGBT region are formed.

DESCRIPTION OF RELATED ART

Japanese Patent Application Laid-Open No. 2008-192737 discloses a semiconductor device having a semiconductor substrate in which a diode region and an IGBT region are formed. A damage layer is formed within the diode region. Since the damage layer becomes a center of recombining of carriers, reverse current that flows in the diode upon reverse recovery is decreased.

BRIEF SUMMARY

A damage layer is normally formed by implanting charged particles into a semiconductor substrate. In a step of implanting charged particles, a manufacturing error of a range in which the charged particles are implanted is large. In a case of the semiconductor device disclosed in the Japanese Patent Application Laid-Open No. 2008-192737, an end of the damage layer is located within the diode region, within the IGBT region, or on a boundary of the diode region and the IGBT region. Therefore if a position of the end of the damage layer is shifted due to the manufacturing error, characteristics of the diode and characteristics of the IGBT change. In other words, in this semiconductor device, the characteristics of the diode and the characteristics of the IGBT easily vary due to the manufacturing error in a range where the damage layer is formed.

The present specification provides a semiconductor device having a diode and an IGBT, wherein characteristics of the diodes and characteristics of the IGBTs hardly vary during mass production.

A semiconductor device disclosed by the present specification includes a semiconductor substrate in which a diode region and an IGBT region are formed. An anode electrode is formed on an upper surface of the semiconductor substrate within the diode region. An emitter electrode is formed on the upper surface of the semiconductor substrate within the IGBT region. A common electrode is formed on a lower surface of the semiconductor substrate. An anode region, a diode drift region and a cathode region are formed within the diode region. The anode region is formed of a p-type semiconductor and in contact with the anode electrode. The diode drift region is formed of an n-type semiconductor and formed under the anode region. The cathode region is formed of an n-type semiconductor, which has a higher concentration of n-type impurities than that in the diode drift region, formed under the diode drift region and in contact with the common electrode. An emitter region, a body region, an IGBT drift region, a collector region and a gate electrode are formed within the IGBT region. The emitter region is formed of an n-type semiconductor and in contact with the emitter electrode. The body region is formed of a p-type semiconductor, formed beside and under the emitter region and in contact with the emitter electrode. The IGBT drift region is formed of an n-type semiconductor and formed under the body region. The collector region is formed of a p-type semiconductor, formed under the IGBT drift region and in contact with the common electrode. The gate electrode is facing a range of the body region via an insulating film, wherein the range of the body region is a range separating the emitter region from the IGBT drift region. A separation region formed of a p-type semiconductor is formed in a range between the diode region and the IGBT region and extending from the upper surface of the semiconductor substrate to a position deeper than both of a lower end of the anode region and a lower end of the body region. A diode lifetime control region is formed within the diode drift region. A carrier lifetime in the diode lifetime control region is shorter than that in the diode drift region outside the diode lifetime control region. An end of the diode lifetime control region on an IGBT region side is located right below the separation region.

The diode lifetime control region is a region wherein a carrier lifetime is shortened, and includes, for example, a region where crystal defects are formed by implanting charged particles. By forming the diode lifetime control region within the diode drift region, carriers in the diode drift region can be more easily recombined and dissipated when the diode performs the reverse recovery. Consequently, the reverse current that flows when the diode performs the reverse recovery can be suppressed. According to this semiconductor device, the end of the diode lifetime control region on the IGBT region side is located right below the separation region, therefore even if the position of the end varies, an area of the diode lifetime control region within the diode region does not change. Consequently, in a case of this semiconductor device, the reverse recovery characteristics of the diodes hardly vary.

BRIEF DESCRIPTION OF DRAWINGS

FIG. 1 is a vertical cross-sectional view of a semiconductor device 10 at a boundary portion between a diode region 20 and an IGBT region 40.

DETAILED DESCRIPTION OF THE PREFERRED EMBODIMENT

An embodiment of a semiconductor device of the present techings may preferably be configured as follows. An IGBT lifetime control region may be formed within a IGBT drift region. A carrier lifetime in the IGBT lifetime control region may be shorter than that in the IGBT drift region outside the IGBT lifetime control region. An end of the IGBT lifetime control region on a diode region side may be located right below a separation region. The IGBT lifetime control region is a region wherein a carrier lifetime is shortened, and includes, for example, a region where crystal defects are formed by implanting charged particles. By forming the IGBT lifetime control region within the IGBT drift region, carriers in the IGBT drift region can be more easily recombined and dissipated when the IGBT turns OFF. This makes it possible to improve the turn OFF speed of the IGBT. According to this semiconductor device, the end of the IGBT lifetime control region on the diode region side is located right below the separation region. Therefore even if the position of the end varies, an area of the IGBT lifetime control region within the IGBT region does not change. Consequently, in the case of this semiconductor device, the turn OFF speeds of the IGBTs hardly vary.

A semiconductor device according to another embodiment will now be described.

(Structure of Semiconductor Device)

As FIG. 1 shows, a semiconductor device 10 has a semiconductor substrate 12, and metal layers and insulating layers which are formed on an upper surface and a lower surface of the semiconductor substrate 12. A diode region 20 and an IGBT region 40 are formed in the semiconductor substrate 12.

An anode electrode 22 is formed on an upper surface of the semiconductor substrate 12 within the diode region 20. An emitter electrode 42 is formed on the upper surface of the semiconductor substrate 12 within the IGBT region 40. A common electrode 60 is formed on a lower surface of the semiconductor substrate 12.

An anode layer 26, a diode drift layer 28 and a cathode layer 30 are formed within the diode region 20.

The anode layer 26 is formed of a p-type semiconductor. The anode layer 26 has an anode contact region 26a and a low concentration anode layer 26b. The anode contact region 26a is formed in an island shape within a range being exposed to the upper surface of the semiconductor substrate 12. The anode contact region 26a has a high concentration of impurities. The anode contact region 26a is connected to the anode electrode 22 by ohmic connection. The low concentration anode layer 26b is formed under and beside the anode contact region 26a so as to cover the anode contact region 26a. A concentration of impurities in the low concentration anode layer 26b is lower than that in the anode contact region 26a.

The diode drift layer 28 is formed under the anode layer 26. The diode drift layer 28 is formed of an n-type semiconductor and has a low concentration of impurities.

The cathode layer 30 is formed under the diode drift layer 28. The cathode layer 30 is formed in a range being exposed to the lower surface of the semiconductor substrate 12. The cathode layer 30 is formed of an n-type semiconductor and has a high concentration of impurities. The cathode layer 30 is connected to the common electrode 60 by ohmic connection.

A diode is formed by the anode layer 26, the diode drift layer 28 and the cathode layer 30.

An emitter region 44, a body layer 48, an IGBT drift layer 50, a collector layer 52 and a gate electrode 54 are formed within the IGBT region 40.

A plurality of trenches is formed on an upper surface of the semiconductor substrate 12 within the IGBT region 40. A gate insulating film 56 is formed on an inner face of each trench. The gate electrode 54 is formed inside each trench. An upper surface of the gate electrode 54 is covered with an insulating film 58. The gate electrode 54 is insulated from the emitter electrode 42.

The emitter region 44 is formed in an island shape in a range being exposed to the upper surface of the semiconductor substrate 12. The emitter region 44 is formed in a range being in contact with the gate insulating film 56. The emitter region 44 is formed of an n-type semiconductor and has a high concentration of impurities. The emitter region 44 is connected to the emitter electrode 42 by ohmic connection.

The body layer 48 is formed of a p-type semiconductor. The body layer 48 has a body contact region 48a and a low concentration body layer 48b. The body contact region 48a is formed in an island shape within a range being exposed to the upper surface of the semiconductor substrate 12. The body contact region 48a is formed between two emitter regions 44.

A concentration of impurities in the body contact region 48a is high. The body contact region 48a is connected to the emitter electrode 42 by ohmic connection. The low concentration body layer 48b is formed under the emitter region 44 and the body contact region 48a. The low concentration body layer 48b is formed in a range shallower than the position of the lower end of the gate electrode 54. A concentration of impurities in the low concentration body layer 48b is lower than that in the body contact region 48a. The emitter region 44 is separated from the IGBT drift layer 50 by the low concentration body layer 48b. The gate electrode 54 is facing the low concentration body layer 48b, which is in a range separating the emitter region 44 from the IGBT drift layer 50, via the gate insulating film 56.

The IGBT drift layer 50 is formed under the body layer 48. The IGBT drift layer 50 is formed of an n-type semiconductor. The IGBT drift layer 50 has a drift layer 50a and a buffer layer 50b. The drift layer 50a is formed under the body layer 48. A concentration of impurities in the drift layer 50a is low. The concentration of impurities in the drift layer 50a is approximately the same as that in the diode drift layer 28, and the drift layer 50a is continuous with the diode drift layer 28. The buffer layer 50b is formed under the drift layer 50a. A concentration of impurities in the buffer layer 50b is higher than that in the drift layer 50a.

The collector layer 52 is formed under the IGBT drift layer 50. The collector layer 52 is formed in a range being exposed to the lower surface of the semiconductor substrate 12. The collector layer 52 is formed of a p-type semiconductor, and has a high concentration of impurities. The collector layer 52 is connected to the common electrode 60 by ohmic connection.

An IGBT is formed by the emitter region 44, the body layer 48, the IGBT drift layer 50, the collector layer 52 and the gate electrode 54.

A separation region 70 is formed between the diode region 20 and the IGBT region 40. The separation region 70 is formed in a range extending from the upper surface of the semiconductor substrate 12 to a position deeper than both of a lower end of the anode layer 26 and a lower end of the body layer 48. To be more precise, the separation region 70 is formed in a range extending from the upper surface of the semiconductor substrate 12 to a position deeper than a lower end of the gate electrode 54. The separation region 70 is in contact with the anode layer 26 and the body layer 48. The separation region 70 is formed of a p-type semiconductor. A concentration of impurities in the separation region 70 is higher than those in the low concentration anode layer 26b and the low concentration body layer 48b. A bottom surface of the separation region 70 is flat. The separation region 70 suppresses an electric field to be concentrated on an area between the anode layer 26 and the body layer 48. In particular, the separation region 70 is formed extending to a position deeper than the lower end of the gate electrode 54, hence an electric field to be concentrated on the gate electrode 54 near the separation region 70 is suppressed.

The diode drift layer 28 and the drift layer 50a are continuous with each other right below the separation region 70. The cathode layer 30 in the diode region 20 extends to a position right below the separation region 70, and the collector layer 52 in the IGBT region 40 extends to the position right below the separation region 70. The cathode layer 30 is in contact with the collector layer 52 in the position right below the separation region 70. In other words, a boundary 72 of the cathode layer 30 and the collector layer 52 is located in the position right below the separation region 70. To be more precise, the boundary 72 is located right below the bottom surface (flat portion) of the separation region 70. The structure of the boundary portion shown in FIG. 1 extends along an area between the diode region 20 and the IGBT region 40. In other words, the boundary 72 extends along the separation region 70 between the diode region 20 and the IGBT region 40.

A diode carrier lifetime control region 39 is formed within the diode drift layer 28. In the diode carrier lifetime control region 39, crystal defects, formed by implanting charged particles in the semiconductor substrate 12, exist. The concentration of the crystal defects in the diode carrier lifetime control region 39 is much higher than that in the diode drift layer 28 around the diode carrier lifeline control region 39. The diode carrier lifetime control region 39 is formed at a depth which is close to the anode layer 26 and deeper than the lower end of the separation region 70. A reference number 39a indicates an end of the diode carrier lifetime control region 39 on the IGBT region 40 side. The crystal defects are distributed along the depth direction (vertical direction in FIG. 1) in an area outside the end 39a (on the IGBT region 40 side). This is because when charged particles are implanted, the implanting depth of the charged particles changes in a peripheral area of an aperture portion of a mask. The concentration of crystal defects distributed along the depth direction is low, and therefore the crystal defects distributed along the depth direction hardly influence the characteristics of the semiconductor device 10. The end 39a of the diode carrier lifetime control region 39 is located right below the separation region 70. To be more precise, the end 39a is located right below the bottom surface (flat portion) of the separation region 70. In other words, the end 39a of the diode carrier lifetime control region 39 extends along the separation region 70 between the diode region 20 and the IGBT region 40.

An IGBT carrier lifetime control region 59 is formed within the drift layer 50a. In the IGBT carrier lifetime control region 59, crystal defects, formed by implanting charged particles in the semiconductor substrate 12, exist. The concentration of the crystal defects in the IGBT carrier lifetime control region 59 is much higher than that in the drift layer 50a around the IGBT carrier lifetime control region 59. The IGBT carrier lifetime control region 59 is formed at a depth which is close to the buffer layer 50b. A reference number 59a indicates an end of the IGBT carrier lifetime control region 59 on the diode region 20 side. The crystal defects are distributed in the depth direction in an area outside the end 59a (on the diode region 20 side). This is because when charged particles are implanted, the implanting depth of the charged particles changes in the peripheral area of an aperture portion of a mask. The concentration of crystal defects distributed along the depth direction is low, and therefore the crystal defects distributed along the depth direction hardly influence the characteristics of the semiconductor device 10. The end 59a of the IGBT carrier lifetime control region 59 is located right below the separation region 70. To be more precise, the end 59a is located right below the bottom surface (flat portion) of the separation region 70. In other words, the end 59a of the IGBT carrier lifetime control region 59 extends along the separation region 70 between the diode region 20 and the IGBT region 40.

(Operation of Diode of Semiconductor Device)

The operation of the diode of the semiconductor device 10 will be described. When voltage to make the anode electrode 22 positive (that is, forward voltage) is applied between the anode electrode 22 and the common electrode 60, the diode turns ON. In other words, electric current flows from the anode electrode 22 to the common electrode 60 via the anode layer 26, the diode drift layer 28 and the cathode layer 30.

In the semiconductor device 10 of the present embodiment, the boundary 72 is located right below the separation region 70. While the diode is ON, electric current flows from the separation region 70 to the cathode layer 30, as an arrow mark 81 in FIG. 1 indicates. While the diode is ON, electric current also flows from the anode layer 26 to the cathode layer 30 right below the separation region 70, as an arrow mark 80 in FIG. 1 indicates. Since the diode drift layer 28 right below the separation region 70 becomes an electric current path like this, the forward ON voltage of this diode is low. However, the diode lifetime control region 39 is formed right below the separation region 70, and carriers that flow from the separation region 70 to the diode drift layer 28 pass through the diode lifetime control region 39, as the arrow mark 81 indicates, hence most of the carriers are recombined and dissipated in the diode lifetime control region 39. Furthermore, a distance from the separation region 70 to the anode electrode 22 is long, therefore electric current does not flow easily on the path indicated by the arrow mark 81. That is, the amount of the electric current that flows as indicated by the arrow mark 81 is low. At the same time, a distance from the cathode layer 30 right below the separation region 70 to the anode layer 26 is also long, that is, the amount of the electric current that flows as indicated by the arrow mark 80 in FIG. 1 is also low. As a consequence, the amount of the electric current that flows in the diode drift layer 28 right below the separation region 70 is low. Because of this, the characteristic of the diode hardly fluctuates, even if a position of the boundary 72 (a position in the width direction (lateral direction in FIG. 1) of the separation region 70) is shifted due to manufacturing error. In other words, the forward ON voltages of the diodes hardly vary during the mass production of the semiconductor device 10.

When the voltage applied to the diode is switched from the forward voltage to the reverse voltage, the diode performs the reverse recovery operation. In other words, holes existing in the diode drift layer 28 when the forward voltage is applied are exhausted to the anode electrode 22, and the electrons existing in the diode drift layer 28 when the forward voltage is applied are exhausted to the common electrode 60. Due to this, reverse current flows in the diode. The reverse current attenuates in a short time, and the amount of the electric current that flows in the diode becomes virtually zero thereafter. The crystal defects in the diode carrier lifetime control region 39 function as recombining centers of carriers. Hence upon performing the reverse recovery operation, most of the carriers in the diode drift layer 28 are recombined and dissipated in the diode carrier lifetime control region 39. Therefore according to the semiconductor device 10, the reverse current generated upon performing the reverse recovery operation is suppressed.

According to the semiconductor device 10 of the present embodiment, the end 39a of the diode carrier lifetime control region 39 is located right below the separation region 70. Even if a position of the end 39a (a position in the width direction (lateral direction in FIG. 1) of the separation region 70) right below the separation region 70 is shifted due to manufacturing error, an area of the diode carrier lifetime control region 39 in the diode region 20 does not change. Further, as mentioned above, the amount of the electric current that flows in the diode drift layer 28 right below the separation region 70 is low. Therefore even if the characteristics of the diode drift layer 28 right below the separation region 70 change because of the shift of the position of the end 39a, the reverse recovery characteristics of the diode are not influenced very much. Hence according to the semiconductor device 10, the reverse recovery characteristics hardly fluctuate much even if the position of the end 39a shifts. This means that the reverse recovery characteristics of the diodes hardly vary during the mass production of the semiconductor device 10.

Moreover, in the semiconductor device 10, the diode carrier lifetime control region 39 extends to a position right below the separation region 70. Therefore carriers existing in the diode drift region 28 right below the separation region 70 recombine in the diode carrier lifetime control region 39. As a consequence, the generation of a large amount of electric current near the separation region 70 upon the reverse recovery operation is prevented.

(Operation of IGBT of Semiconductor Device)

Operation of the IGBT of the semiconductor device 10 will be described. When voltage to make the common electrode 60 positive is applied between the emitter electrode 42 and the common electrode 60, and ON potential (potential higher than the potential required for forming a channel) is applied to the gate electrode 54, the IGBT turns ON. In other words, a channel is formed in a range of the low concentration body layer 48b being in contact with the gate insulating film 56 by the ON potential applied to the gate electrode 54. Then electrons flow from the emitter electrode 42 to the common electrode 60 via the emitter region 44, the channel, the IGBT drift layer 50 and the collector layer 52. Holes, on the other hand, flow from the common electrode 60 to the emitter electrode 42 via the collector layer 52, the IGBT drift layer 50, the low concentration body layer 48b and the body contact region 48a. In other words, electric current flows from the common electrode 60 to the emitter electrode 42.

According to the semiconductor device 10 of the present embodiment, the boundary 72 is located right below the separation region 70. When the IGBT is ON, electric current flows from the collector layer 52 to the separation region 70, as an arrow mark 83 in FIG. 1 indicates. When the IGBT is ON, electric current also flows from the collector layer 52 right below the separation region 70 to the body layer 48, as an arrow mark 82 in FIG. 1 indicates. Since the IGBT drift layer 50 right below the separation region 70 also becomes an electric current path like this, the ON voltage of the IGBT is low. However, the IGBT lifetime control region 59 is formed right below the separation region 70, and, as an arrow 83 indicates, carriers that flow from the IGBT drift layer 50 to the separation region 70 passes through the IGBT lifetime control region 59, hence most of the carriers are recombined and dissipated in the IGBT lifetime control region 59. Moreover, the distance from the separation region 70 to the emitter electrode 42 is long, therefore electric current hardly flows on the path indicated by the arrow mark 83. Because of this, the amount of the electric current that flows as indicated by the arrow mark 83 is low. Furthermore, the distance from the collector layer 52 right below the separation region 70 to the body layer 48 is long, therefore electric current that flows as indicated by the arrow mark 82 in FIG. 1 is low. Thus the amount of the electric current that flows in the IGBT drift layer 50 right below the separation region 70 is low. Therefore even if a position of the boundary 72 (a position in the width direction (lateral direction in FIG. 1) of the separation region 70) is shifted due to manufacturing error, the characteristics of the IGBT hardly fluctuate. This means that the ON voltages of the IGBTs hardly vary during the mass production of the semiconductor device 10.

When the potential applied to the gate electrode 54 is switched from ON potential to OFF potential, the IGBT turns OFF. In other words, holes existing in the IGBT drift layer 50 when the IGBT is ON are exhausted to the common electrode 60, and electrons existing in the IGBT drift layer 50 when the IGBT is ON are exhausted to the emitter electrode 42. Due to this, reverse current flows in the IGBT. The reverse current attenuates in a short time, and the amount of the electric current that flows in the IGBT becomes virtually zero thereafter. The crystal defects in the IGBT carrier lifetime control region 59 function as recombining centers of carriers. Hence upon performing the turn OFF operation, most of the carriers in the IGBT drift layer 50 are recombined and dissipated in the IGBT carrier lifetime control region 59. Therefore the amount of the reverse current generated upon performing the turn OFF operation is suppressed. Thereby the turns OFF speed of the IGBT is improved.

According to the semiconductor device 10 of the present embodiment, the end 59a of the IGBT carrier lifetime control region 59 is located right below the separation region 70. Even if a position of the end 59a (position in the width direction (lateral direction in FIG. 1) of the separation region 70) right below the separation region 70 is shifted due to manufacturing error, an area of the IGBT carrier lifetime control region 59 in the IGBT region 40 does not change. Further, as mentioned above, the amount of the electric current that flows in the IGBT drift layer 50 right below the separation region 70 is low. Therefore even if the characteristics of the IGBT drift layer 50 right below the separation region 70 change because of the shift of the position of the end 59a, the turn OFF speed of the IGBT is not influenced very much. Hence according to the semiconductor device 10, the turn OFF speed of the IGBT hardly fluctuates even if the position of the end 59a shifts. This means that the turn OFF speeds of the IGBTs hardly vary during mass production of the semiconductor device 10.

Moreover, in the semiconductor device 10, the IGBT carrier lifetime control region 59 extends to a position right below the separation region 70. Therefore carriers existing in the IGBT drift region 50 right below the separation region 70 recombine in the IGBT carrier lifetime control region 59. As a consequence, the generation of a large amount of electric current near the separation region 70 when IGBT is turned OFF is prevented.

As described above, according to the semiconductor device 10 of the present embodiment, the boundary 72, the end 39a of the diode carrier lifetime control region 39 and the end 59a of the IGBT carrier lifetime control region 59 are located right below the separation region 70. In other words, the separation region 70 has a sufficient width so that the boundary 72, the end 39a and the end 59a are located right below the separation region 70 even if the boundary 72, the end 39a and the end 59a are shifted due to manufacturing error. Because of this, the forward ON voltages of the diodes, the reverse recovery characteristics of the diodes, the ON voltages of the IGBTs, and the turn OFF speeds of the IGBTs hardly vary during the mass production of the semiconductor device 10. As a consequence, the semiconductor device 10 can be manufactured with stable quality.

In the semiconductor device 10 of the above mentioned embodiment, the lifetime control regions 39 and 59 are formed within the diode region 20 and within the IGBT region 40 respectively, but the lifetime control region may be formed only within one of the diode region 20 and the IGBT region 40.

What is claimed is:

1. A semiconductor device comprising a semiconductor substrate in which a diode region and an IGBT region are formed, wherein
an anode electrode is formed on an upper surface of the semiconductor substrate within the diode region, an emitter electrode is formed on the upper surface of the semiconductor substrate within the IGBT region, a common electrode is formed on a lower surface of the semiconductor substrate, an anode region, a diode drift region and a cathode region are formed within the diode region, the anode region is formed of a p-type semiconductor and in contact with the anode electrode, the diode drift region is formed of an n-type semiconductor and formed under the anode region, the cathode region is formed of an n-type semiconductor, which has a higher concentration of n-type impurities than that in the diode drift region, formed under the diode drift region and in contact with the common electrode, an emitter region, a body region, an IGBT drift region, a collector region and a gate electrode are formed within the IGBT region, the emitter region is formed of an n-type semiconductor and in contact with the emitter electrode, the body region is formed of a p-type semiconductor, formed beside and under the emitter region and in contact with the emitter electrode, the IGBT drift region is formed of an n-type semiconductor and formed under the body region, the collector region is formed of a p-type semiconductor, formed under the IGBT drift region and in contact with the common electrode, the gate electrode is facing a range of the body region via an insulating film, wherein the range of the body region is a range separating the emitter region from the IGBT drift region, a separation region formed of a p-type semiconductor is formed in a range between the diode region and the IGBT region and extending from the upper surface of the semiconductor substrate to a position deeper than both of a lower end of the anode region and a lower end of the body region, a diode lifetime control region is formed within the diode drift region, wherein a carrier lifetime in the diode lifetime control region is shorter than that in the diode drift region outside the diode lifetime control region, and an end of the diode lifetime control region on an IGBT region side is located right below the separation region.

2. The semiconductor device of claim 1, wherein an IGBT lifetime control region is formed within the IGBT drift region, wherein a carrier lifetime in the IGBT lifetime control region is shorter than that in the IGBT drift region outside the IGBT lifetime control region, and an end of the IGBT lifetime control region on a diode region side is located right below the separation region.

\* \* \* \* \*